United States Patent [19]

Devereaux et al.

[11] Patent Number: 5,279,975

[45] Date of Patent: Jan. 18, 1994

[54] METHOD OF TESTING INDIVIDUAL DIES ON SEMICONDUCTOR WAFERS PRIOR TO SINGULATION

[75] Inventors: Kevin M. Devereaux; Mark Bunn; Brian Higgins, all of Boise, Id.

[73] Assignee: Micron Technology, Inc., Boise, Id.

[21] Appl. No.: 832,785

[22] Filed: Feb. 7, 1992

[51] Int. Cl.$^5$ .................. H01L 21/66; H01L 21/60
[52] U.S. Cl. .............................. 437/8; 437/227; 371/21.4; 371/21.6
[58] Field of Search ............ 437/226, 227, 8; 148/DIG. 28; 371/21.4, 21.6

[56] References Cited

U.S. PATENT DOCUMENTS

| | | | |
|---|---|---|---|
| 3,795,972 | 3/1974 | Calhoun | 437/8 |
| 3,835,530 | 9/1974 | Kilby | 437/8 |
| 3,839,781 | 10/1974 | Russell | 29/574 |
| 3,849,872 | 11/1974 | Hubacher | 29/574 |
| 4,104,785 | 8/1978 | Shiba et al. | 437/8 |
| 4,288,911 | 9/1981 | Ports | 437/8 |
| 4,778,771 | 10/1988 | Hiki | 437/8 |
| 4,866,714 | 9/1989 | Adams et al. | 371/22.1 |
| 4,967,146 | 10/1990 | Morgan et al. | 437/8 |
| 5,047,711 | 9/1991 | Smith et al. | 324/158 R |
| 5,059,899 | 10/1991 | Farnworth et al. | 324/158 R |

FOREIGN PATENT DOCUMENTS 57-188159 7/1982 Japan.

Primary Examiner—Olik Chaudhuri
Assistant Examiner—David E. Graybill
Attorney, Agent, or Firm—Wells, St. John, Roberts, Gregory & Matkin

[57] ABSTRACT

A method of processing and testing a semiconductor wafer containing an array of integrated circuit dies comprises: a) providing die test cycling circuitry on the wafer b) etching contact openings through a passivation layer atop the wafer to Vcc and Vss pads associated with individual dies; c) patterning a layer of conductive material atop the water to provide a Vcc bus and a Vss bus which interconnect with the Vcc and Vss pads respectively, the Vcc bus electrically connecting with the test cycling circuitry; d) burn-in testing the wafer with selected voltages being applied to the Vss and Vcc buses e) etching the Vcc bus and Vss bus from the wafer; f) etching contact openings through the passivation layer to conductive pads on individual dies; g) testing the individual dies for operability by engaging the conductive pads with testing equipment; h) identifying operable dies; i) singulating the dies; and j) collecting the operable dies.

13 Claims, 7 Drawing Sheets

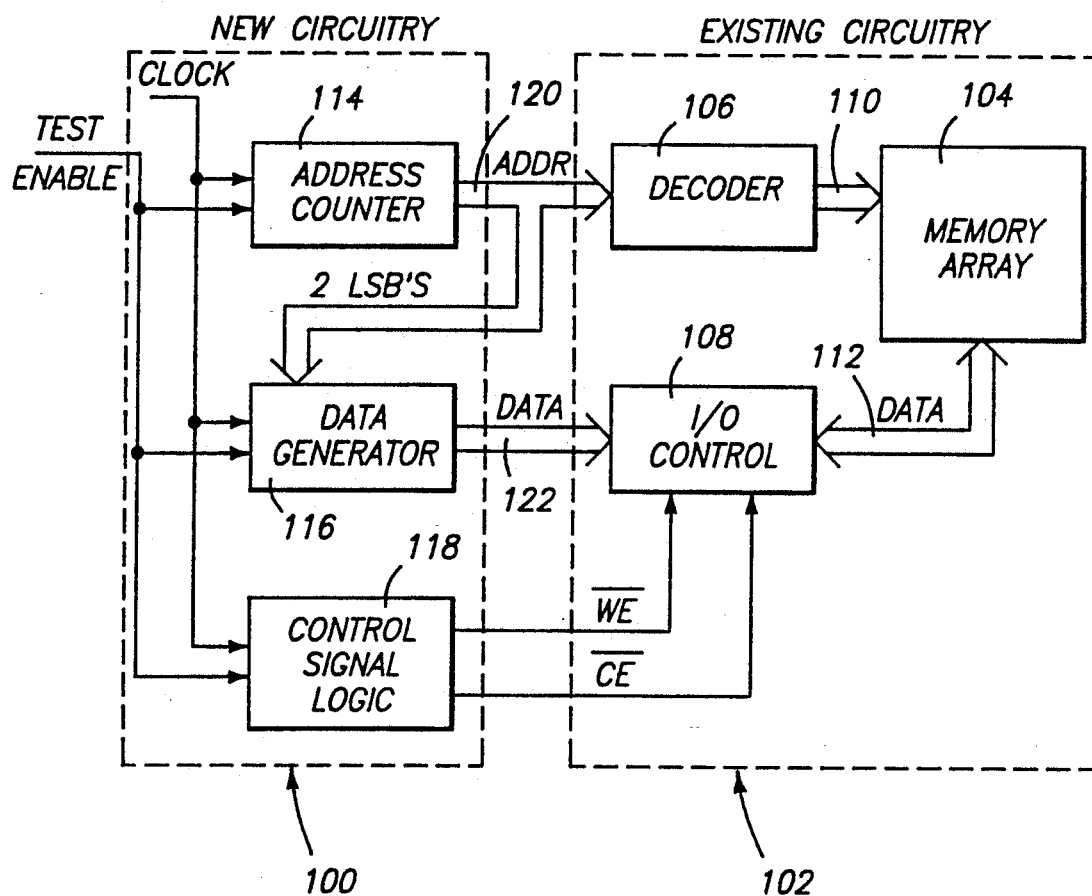

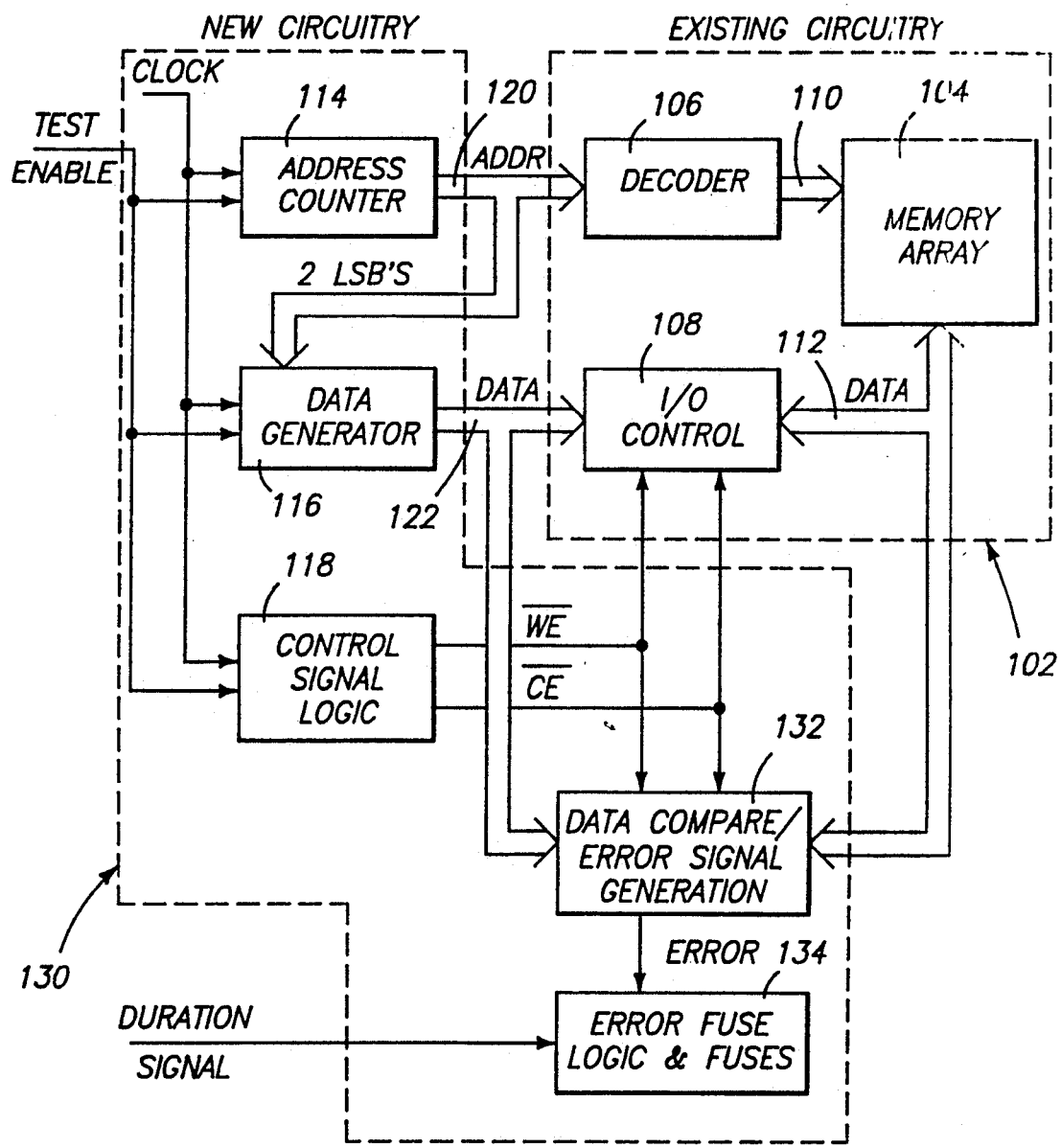

METHOD OF TESTING INDIVIDUAL DIES ON SEMICONDUCTOR WAFERS PRIOR TO SINGULATION

TECHNICAL FIELD

This invention relates generally to (1) methods of processing and of testing a semiconductor wafer containing an array of integrated circuitry, (2) such semiconductors wafers, and (3) a semiconductor wafer processing fixture for conducting burn-in test cycling of such semiconductor wafers.

BACKGROUND OF THE INVENTION

Processed semiconductor wafers typically comprise an array of substantially isolated integrated circuitry which are individually referred to as "dies". The "dies" are also commonly referred to as "chips" and comprise the finished circuitry components of, for example, processors and memory circuits. One common type of memory circuitry comprises DRAM chips.

Not all chips provided on a semiconductor wafer prove operable, resulting in a less than 100% yield. Accordingly, individual dies must be tested for functionality. The typical test procedure for DRAM circuitry is to first etch the upper protective passivation layer to expose desired bonding pads on the individual dies. Thereafter, the wafer is subjected to test probing whereby the individual dies are tested for satisfactory operation. Inoperable dies are typically identified by an ink mark. The wafer is severed between the individual dies, and the operable, non-marked dies are collected.

The "operable" individual dies are then assembled in final packages of either ceramic or plastic. After packaging, the dies are loaded into burn-in boards which comprise printed circuit boards having individual sockets connected in parallel. The burn-in boards are then put into a burn-in oven and the parts are subjected to burn-in testing. Thereafter, the dies are re-tested for operability. In other words, the dies are subjected to a test after severing and packaging, and have an individual opportunity to fail. Note that such requires two separate tests.

U.S. Pat. No. 5,047,711 to Smith et al. discloses a technique whereby individual circuits are subjected to burn-in testing while still constituting a part of a yet to be severed wafer. It would be desirable to improve upon these and other techniques for fabricating wafers and testing individual dies prior to their severing from the semiconductor wafer.

BRIEF DESCRIPTION OF THE DRAWINGS

Preferred embodiments of the invention are described below with reference to the following accompanying drawings.

FIG. 8 is a schematic, block diagram view of test cycling circuitry in accordance with the invention.

FIG. 9 is a schematic, block diagram view of test cycling circuitry in accordance with the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a method of processing and of testing a semiconductor wafer containing an array of integrated circuit dies comprises the following steps:
- providing die test cycling circuitry on the wafer for test cycling individual dies;
- providing a passivation layer atop the wafer;
- etching contact openings through the passivation layer to Vcc and Vss pads associated with individual dies;
- providing a layer of conductive material atop the wafer;
- patterning the layer of conductive material to provide a Vcc bus and a Vss bus which interconnect with the Vcc and Vss pads respectively, the Vcc bus electrically connecting with the test cycling circuitry;
- burn-in testing the wafer with selected voltages being applied to the Vss and Vcc buses to cycle the individual dies during burn-in testing;
- etching the Vcc bus and Vss bus from the wafer;
- etching contact openings through the passivation layer to conductive pads on individual dies;
- testing the individual dies on the wafer for operability by engaging the conductive pads with testing equipment;
- identifying operable and inoperable dies;
- severing through the wafer to singulate the dies; and
- collecting the operable dies.

In accordance with another aspect of the invention, a plurality of individual dies containing integrated circuits arrayed for singulation from the wafer comprises:
- test cycling circuitry for test cycling individual dies;
- a passivation layer;
- Vcc and Vss pads associated with individual dies;
- electrical contacts extending through the passivation layer to the Vcc and Vss pads;
- a Vcc bus provided atop the passivation layer which electrically connects with the Vcc pads and test circuitry; and
- a Vss bus provided atop the passivation layer which electrically connects with the Vss pads.

In accordance with yet another aspect of the invention, a semiconductor wafer processing fixture for conducting burn-in-test cycling of a semiconductor wafer comprises:
- a wafer cavity sized to receive and register a semiconductor wafer in a selected orientation;
- the wafer cavity including a base for receiving a substrate portion of the semiconductor wafer, the base comprising means for reverse biasing the substrate portion of the semiconductor wafer during burn-in test cycling; and electrical connector means for supplying selected voltages to the wafer Vcc and Vss buses for imparting test cycling of the integrated circuits upon application of the selected voltages.

Figure 1:
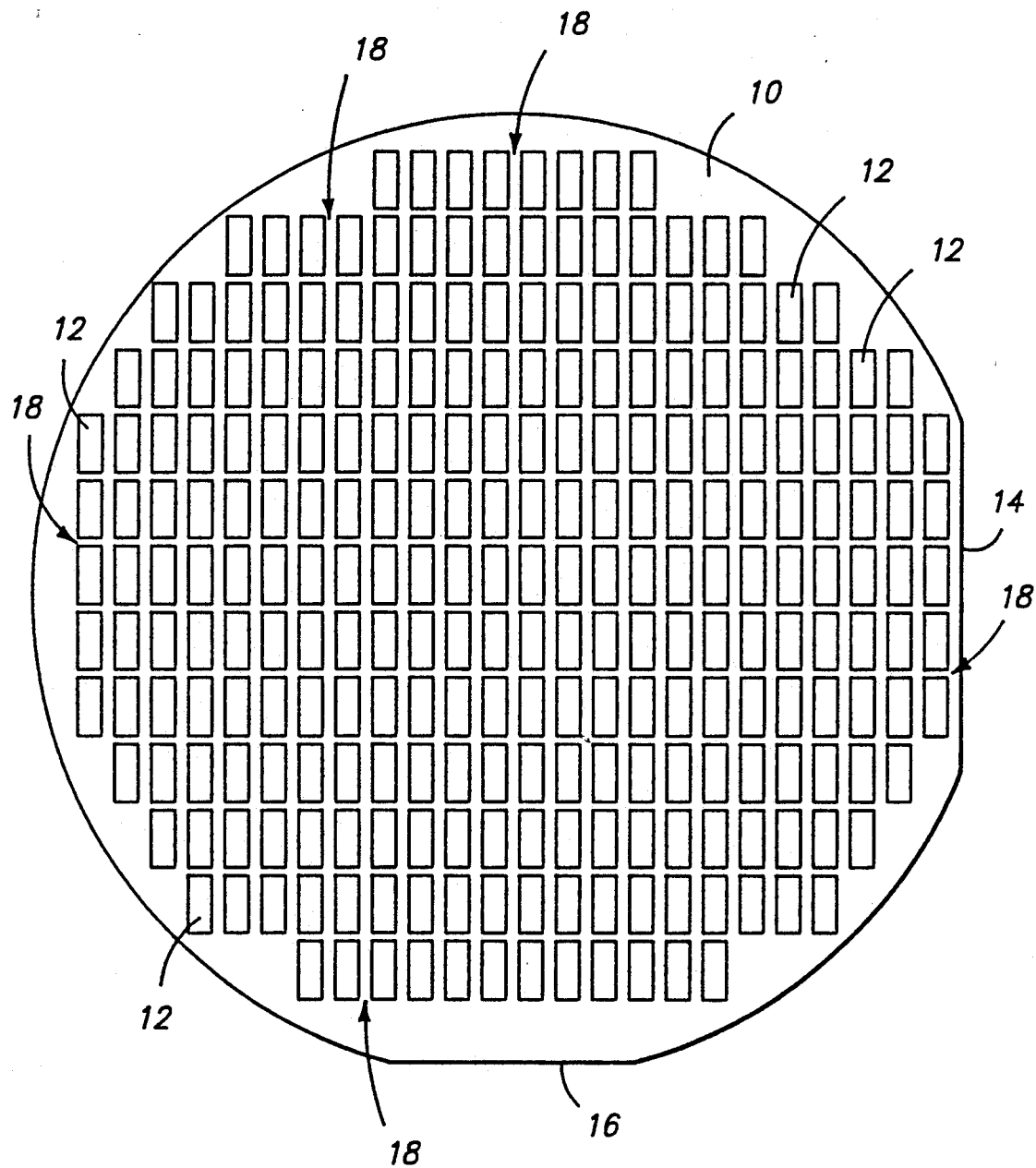
FIG. 1 is a diagrammatic top plan view of a semiconductor wafer processed in accordance with the invention.

Referring more particularly to the figures, FIG. 1 illustrates a semiconductor wafer 10 comprised of an array of integrated circuit dies 12 designed for singulation from the wafer. Illustrated is a p-type wafer having flats 14, 16. Areas 18 are provided between individual dies 12 to define scribe line areas through which the wafer will be severed to produce singulated dies 12.

Die test cycling circuitry is provided on wafer 10 for test cycling the individual dies. Preferably, individual test cycling circuitry is associated with each of the individual dies. As one example, the individual test cycling circuitry could be positioned within the scribe line area 18. Example techniques for incorporating circuitry within scribe line area is described in our U.S. Pat. No. 5,059,899. Alternately, and as is described with reference to the preferred embodiment of the drawings, the individual test cycling circuitry is provided on each of the individual dies. Example test cycling circuitry is described in more detail below.

Figure 3:
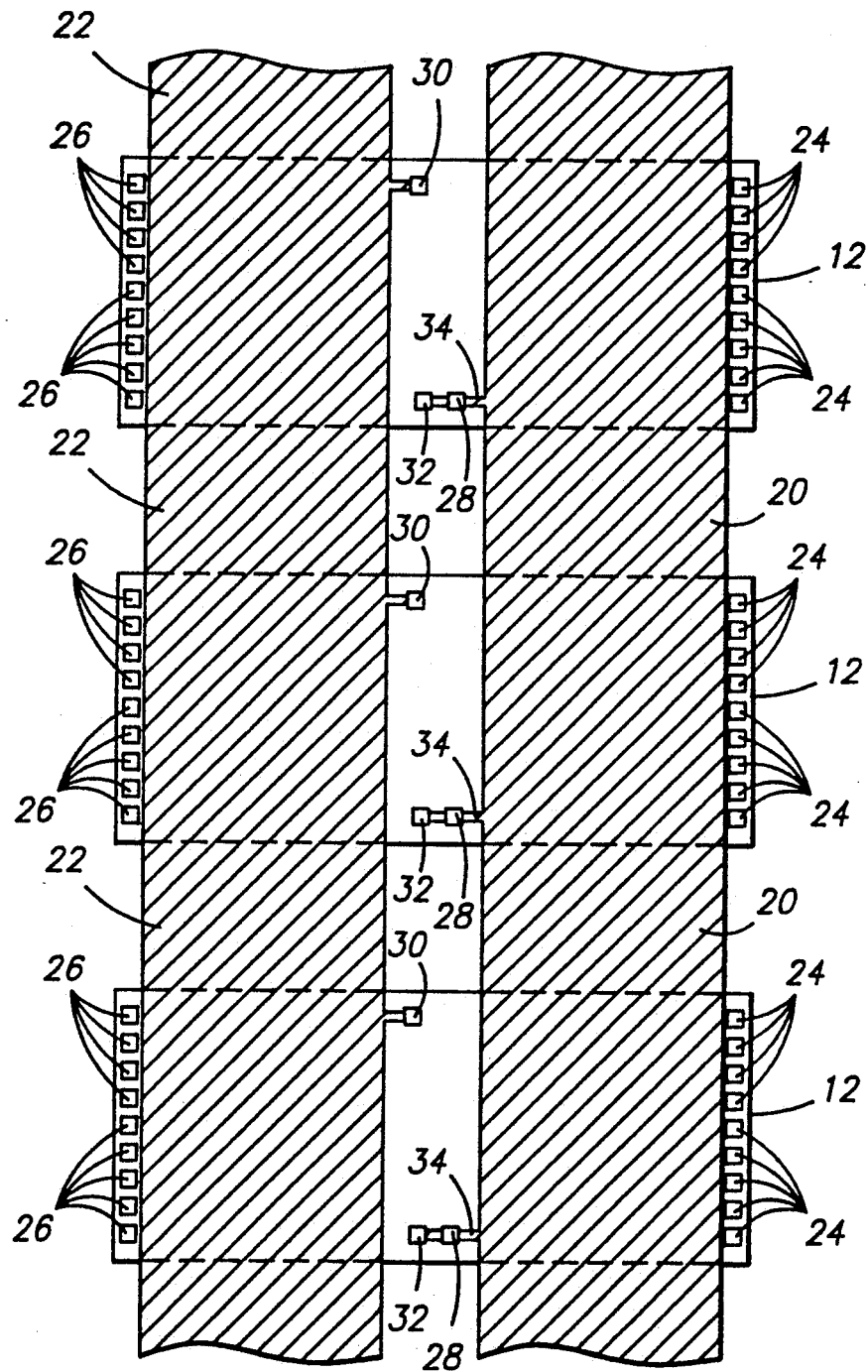
FIG. 3 is an enlarged top plan view of a portion of the FIG. 2 wafer, illustrating three adjacent die from such wafer.

Referring to FIG. 3, a series of three adjacent dies 12 is illustrated. Also illustrated are conductive buses 20, 22 which will be described more fully below. Dies 12 each comprise a series of top and bottom enlarged bonding pads 24, 26, respectively. Bonding pads 24 and 26 comprise enlarged electrical connections which extend to the microscopic integrated circuitry formed within each of dies 12. Such pads will be utilized for interconnecting the circuitry of dies 12 during test and in final operation to components on a larger printed circuit board typically through a finished package having pins. Typically, one of pads 24, 26 will comprise a Vcc pad which will provide a desired operating voltage to the chip, such as five volts, to power the circuit operation. As well, one of pads 24, 26 will comprise a Vss pad for connecting the specific chip 12 to a lower voltage, such as ground, for completing the circuit.

Wafer 10 is typically provided with a passivation layer (not shown in the drawings) which covers the entire top surface of the wafer. Such is an insulating and protective layer that prevents mechanical and chemical damage during assembly and packaging of individual dies or chips. Ultimately, contact openings are etched through the passivation layer to expose the various bonding pads 24, 26 for testing and ultimate operation of operable dies.

Individual dies 12 of wafer 10 are illustrated as having been patterned to provide secondary or sacrificial Vcc pad 28 and secondary or sacrificial Vss pad 30. Sacrificial Vcc pad 28 and sacrificial Vss pad 30 would be connected by circuitry on the dies to the permanent Vcc pad and Vss pad of peripheral pads 24, 26, and are thus connected to the respective pads in parallel. Additionally, test cycling circuitry (not shown) is provided on individual dies 12, and has a cycling test pad 32 associated therewith which electrically engages the test circuitry. The test circuitry is preferably designed to repeatedly cycle the chip instantly upon application of Vcc voltage, and is described in more detail below. Pads 28, 30, and 32 are shown for illustration purposes to the sides of buses 20 and 22. However, pads 28, 30, and 32 may be located in other areas of the wafer, such as beneath their respective buses 20 and 22.

Figure 2:
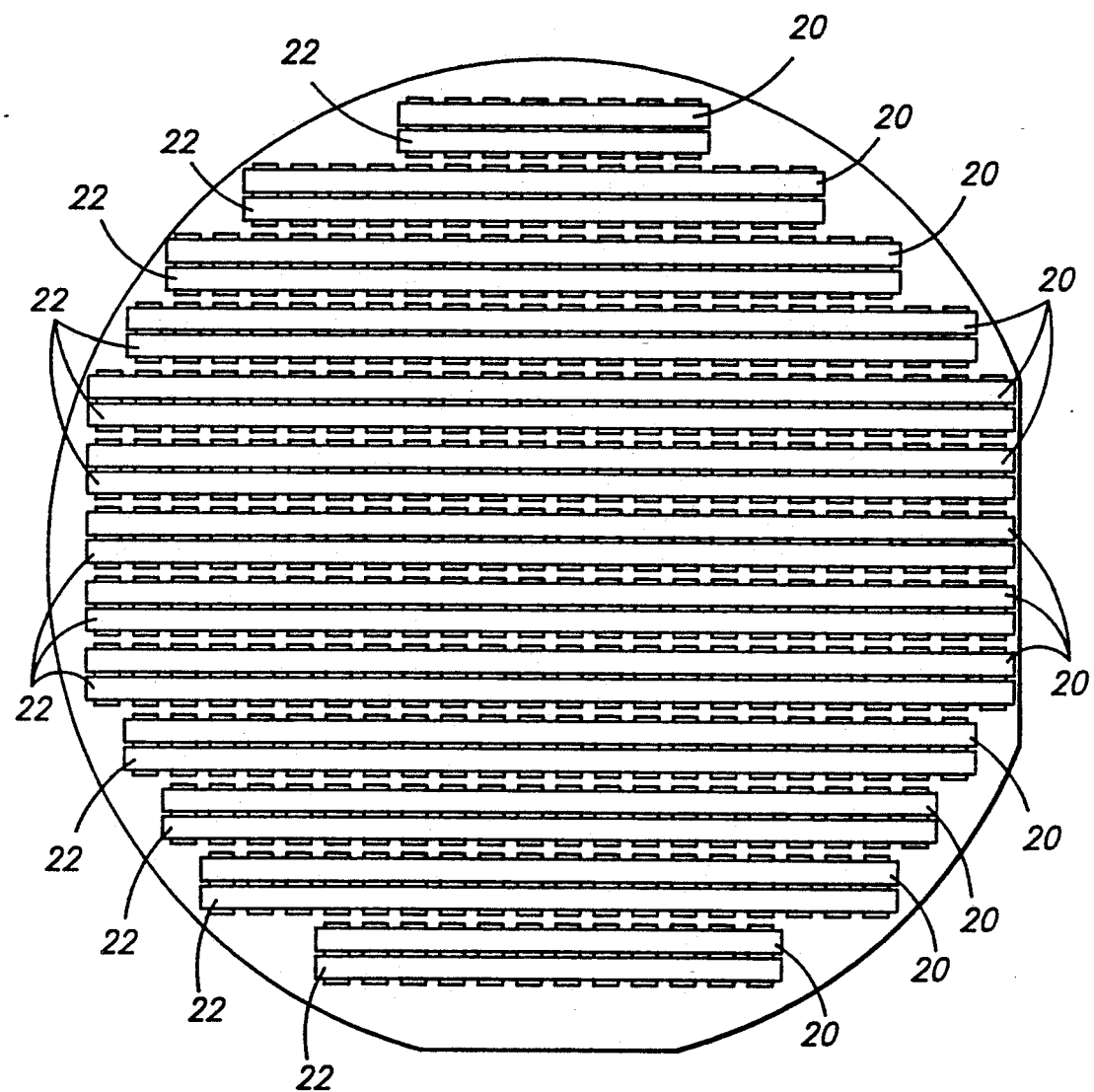
FIG. 2 is a diagrammatic top plan view of the FIG. 1 wafer illustrated at a processing step subsequent to that shown by FIG. 1.

In accordance with the preferred aspects of the invention, the passivation layer is patterned to expose pads 28, 30 and 32 associated with each die 12. Thereafter, a layer of conductive material, preferably metal, is applied atop the wafer. Such conductive layer is then patterned to provide a series of Vcc buses 20 and Vss buses 22, as illustrated in FIGS. 2 and 3. Vcc bus 20 connects with the sacrificial Vcc pads 28 and as well connects with test cycling pads 32. In this manner, the Vcc bus electrically connects with both the test cycling circuitry and the Vcc circuitry on the individual dies. As well, Vss bus 22 connects with sacrificial Vss pads 30. Additionally, the conductive layer is patterned to provide fuses 34 between Vcc bus 22 and individual Vcc sacrificial pads 28. The purpose of fuses 34 is described in more detail below.

Burn-in testing of the wafer would then be conducted, typically in a furnace. Burn-in testing purposefully stresses the circuitry provided on each die to discover potential defects. Burn-in testing, which preferably includes applying various temperatures and voltages to the dies, effectively accelerates the life of the circuitry on the dies to determine when the circuitry fails. During burn-in testing, the desired selected voltages are applied to Vss bus 22 and Vcc bus 20. The desired voltage of Vcc would as well be provided to test pads 32, thus causing the individual dies to be cycled during burn-in testing. Fuses 34 are associated with each die in the event current in any one chip would become too high the result of failed design within the individual chip. For example, were there a Vcc to Vss short or latch-up in an individual chip, current flow to the individual chips could reach one amp. This would result in what would be a comparatively massive amount of current being supplied to the die. Such current might damage or destroy the bus or wafer and associated dies. Accordingly, the fuse would be constructed to blow at some predetermined current value to prevent such high current flows.

Upon completion of the burn-in test, Vcc bus 20 and Vss bus 22 would be etched from the wafer. Such is preferably conducted without any intervening patterning of the Vcc and Vss buses. Any over-etching of the Vcc and Vss buses would be of no concern as pads 28, 30 and 32 are sacrificial, and protected therebeneath by oxide.

At this point in the process, wafer 10 would then be patterned and etched to provide contact openings through the passivation layer to expose all conductive bonding and test pads 24, 26 necessary for ultimate bonding and test of the wafer. The entire wafer would then be subjected to a single testing for operability of individual dies by engaging selective conductive pads 24 and 26 with testing equipment. Operable and inoperable dies would thereafter be identified, such as marking the inoperable dies and leaving the operable dies without marks. The wafer would then be severed and operable dies collected.

Note that such techniques enable the entire wafer to be subjected to a single test which would determine operable dies. Such would thereby without previous differentiation determine which dies were operable after burn-in. Accordingly, a single test is conducted on all of the chips while they are in complete wafer form, as opposed to a test that is conducted on the chips after singulation.

Note as an alternate and less preferred process, it would not be necessary to provide separate Vcc pads and Vss pads. In accordance with this less preferred aspect of the invention, the ultimate or permanent Vcc and Vss pads 24, 26 would be etched prior to conductive film application. Additionally, a test pad would be etched prior to metal film application. Thereafter, the metal film would be applied and patterned to provide the above described bus construction. Upon completion of the test, the bus metal needs to be stripped from the wafer. With this method, a photoresist step would most likely be necessary to protect the metal projecting upward from the permanent Vss and Vcc pads through the passivation layer, as these contacts must ultimately be used in the finished product. Failure to protect such areas could result in an etch and probably destruction of the pad. Note that in this less preferred method, a probable extra photoresist step is necessary which was not required in the above described technique.

Also alternately, such Vcc, Vss and test pads for purpose of bus construction could be provided within the scribe line area and interconnected in parallel with the desired circuitry on the individual chips.

FIG. 8 shows test cycling circuitry 100 in accordance with one aspect of the invention. Cycling circuitry 100 is provided on the individual dies 12 or in scribe line area 18. Test cycling circuitry 100 interfaces with the integrated circuitry 102 provided on each die 12. Integrated circuitry 102 comprises a memory array 104, a decoder 106, and an I/O control 108. Integrated circuitry 102 represents the basic circuitry employed in conventional memory ICs, such as SRAM or DRAM chips. Decoder 106 is coupled to memory array 104 through address bus 110. I/O control 108 is coupled to memory array 104 through data bus 112.

Test cycling circuitry 100 comprises an address counter 114, a data generator 116, and control signal logic 118. These components of cycling circuitry 100 are all activated during burn-in testing by a test enable signal. A clock signal is also provided to synchronize the operation of address counter 114, data generator 116, and control signal logic 118.

Address counter 114 is coupled to decoder 106 via address bus 120. Address counter 114 sequentially addresses every memory cell location in memory array 104. In this manner, every memory location of memory array 104 can be stressed during the burn-in testing to evaluate the quality of die 12. Two of the address bits generated by counter 114 are input to data generator 116. Preferably, the two address bits are the two least significant bits in the address sent to decoder 106, although other address bits may be employed. Data generator 116 utilizes the two bits to generate data in the form of binary "1s" and "0s". This data is written into each memory cell in memory array 104 (via bus 122, I/O control 108, and bus 112). Accordingly, as address counter 114 sequentially selects memory locations, data generator 116 writes data into the selected memory locations.

Control signal logic 118 generates the control signals which operate I/O control 108. These control signals typically include write enable WE and chip enable CE, although other control signals such as output enable OE may also be required. Control signal logic 118 therefore controls data access during burn-in testing between data generator 116 and memory array 104.

During burn-in testing, cycling circuitry 100 cycles its associated individual die 12. That is, cycling circuitry 100 addresses and writes data to every storage cell in memory array 104 on die 12.

FIG. 9 shows a test cycling circuitry 130 in accordance with another aspect of the invention. Cycling circuitry 130 has the basic components used in circuitry 100 (FIG. 8), but also includes a means for detecting when the memory circuitry fails during the burn-in testing. This "intelligent" test cycling circuitry 130 allows IC manufacturers to determine the overall field reliability of their chips.

Cycling circuitry 130 comprises an address counter 114, data generator 116, control signal logic 118, a data comparison circuit 132, and a fuse circuit 134. Counter 114, data generator 116, and control signal logic 118 are configured in the same manner discussed above with reference to cycling circuitry 100 shown in FIG. 8. Data comparison circuit 132 is coupled to receive test data generated by data generator 116 over bus 122 and actual data read from memory array 104 over bus 112. Data comparison circuit 132 further receives control signals (such as write enable WE and chip enable CE) from control signal logic 118. Data comparison circuit 132 compares the test data written to memory array 104 with the actual data read from memory array 104. In this manner, if memory array 104 fails to properly or inaccurately store the test data, the actual data read from memory array 104 will not be the same as the test data written to memory array 104. Data comparison circuit 132 generates an error detection signal when the test data written to memory array 104 is not the same as the actual data read from memory array 104. The error detection signal is output to an error fuse circuit 134.

Error fuse circuit 134 comprises a set of fuses and corresponding logic circuitry. The logic circuitry is designed to blow certain fuses upon receipt of the error detection signal from data comparison circuit 132. The fuses are preferably blown in a binary fashion which indicates the stage of the burn-in testing that the die failed. IC manufacturers can then use this information to determine the reliability of their dies.

Preferably, the burn-in testing is divided into equal time segments or phases. A duration signal is input to error fuse circuit 134 to indicate the phase of the burn-in testing. When an error detection signal is received from data comparison circuit 132, the logic in fuse circuit 134 blows certain ones of the fuses in a binary manner to indicate the phase of the burn-in testing cycle that the die failed. For example, suppose that the burn-in cycle was divided into five equal segments of time. Fuse circuitry 134 would have a set of three fuses. If the die failed in the first time segment of testing, one of the fuses would be blown such that during subsequent probing, a digital code of 001 could be detected. The code 001 indicates that the die failed in the first time segment. If failure occurred in the third time segment, the fuses would be blown to create a digital code of 011. In this manner, the IC manufacturers can determine where in the burn-in cycle failure occurred.

To facilitate such tests, a special testing fixture capable of being inserted in a furnace and electrically connected can be utilized. Such a preferred embodiment fixture is described with reference to FIGS. 4–7. Illustrated is a semiconductor processing fixture 40 comprised of two opposing members 42, 44. Member 42 comprises a top plate, while member 44 comprises a bottom plate. Such plates are joined together and define a cavity 46 sized to receive and register semiconductor wafer 10 in a selected orientation.

Figure 4:
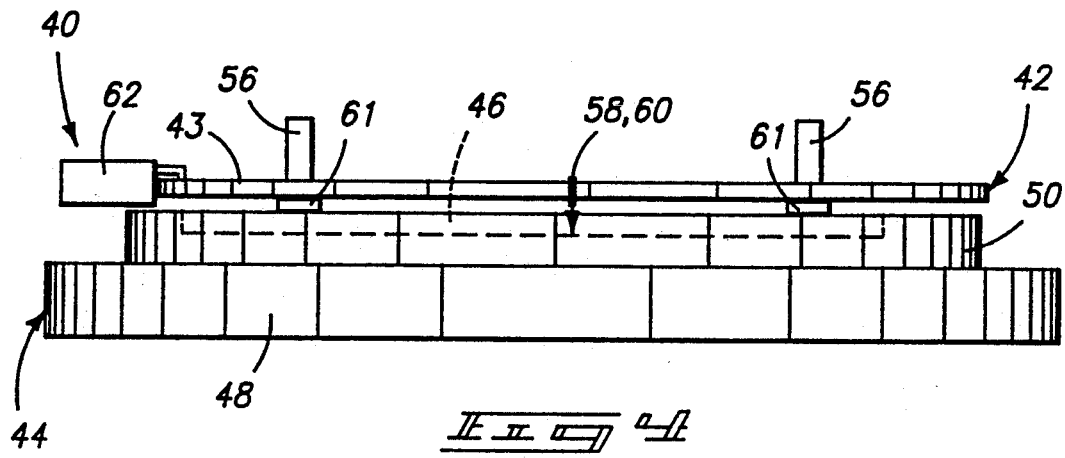
FIG. 4 is a side elevational view of a semiconductor wafer processing fixture in accordance with the invention.
Figure 6:
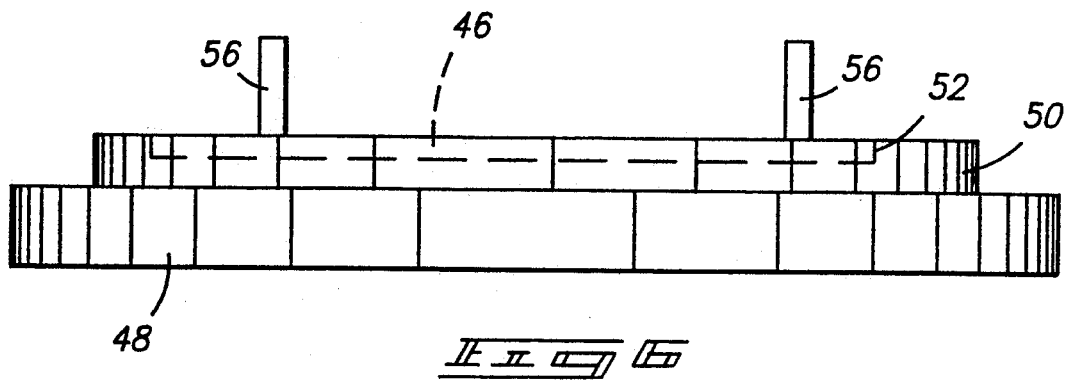
FIG. 6 is a side elevational view of a bottom plate of the FIG. 4 fixture.
Figure 7:
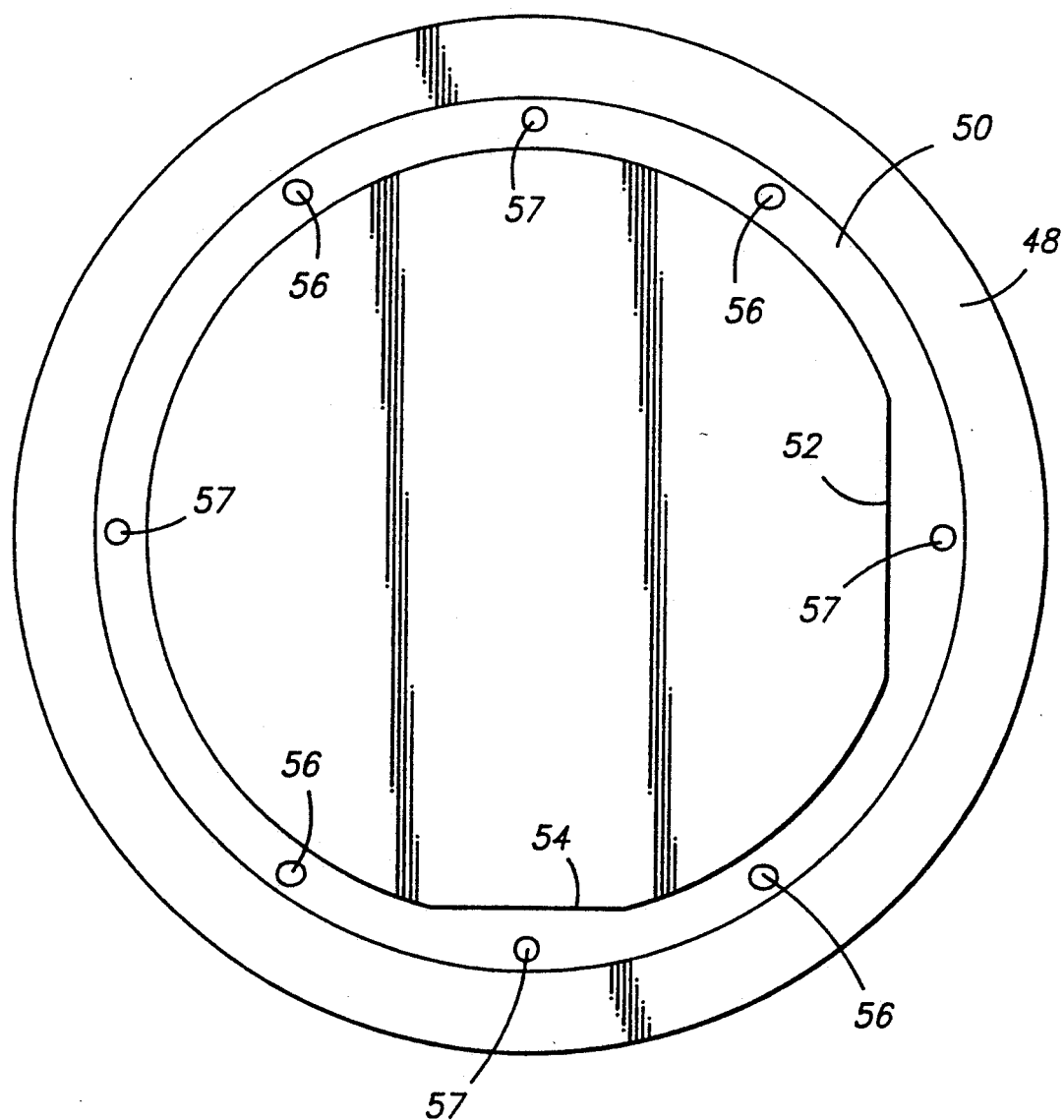
FIG. 7 is a top plan view of the FIG. 6 plate.

More particularly, and with reference to FIGS. 4, 6 and 7, lower plate 44 comprises a phenolic base member 48 which supports an aluminum block 50. Block 50 is provided with cavity 46 therein, which has flats 52, 54 for registering wafer 10 in a desired orientation. Base block 50 receives wafer substrate 10 within cavity 46. A series of four guide pins 56 project upwardly from aluminum base 50. Also, a series of four threaded openings 57 are provided. Base 50 is connected to a suitable low, negative voltage and comprises a means for reverse biasing the substrate portion of the semiconductor wafer during burn-in test cycling.

Figure 5:
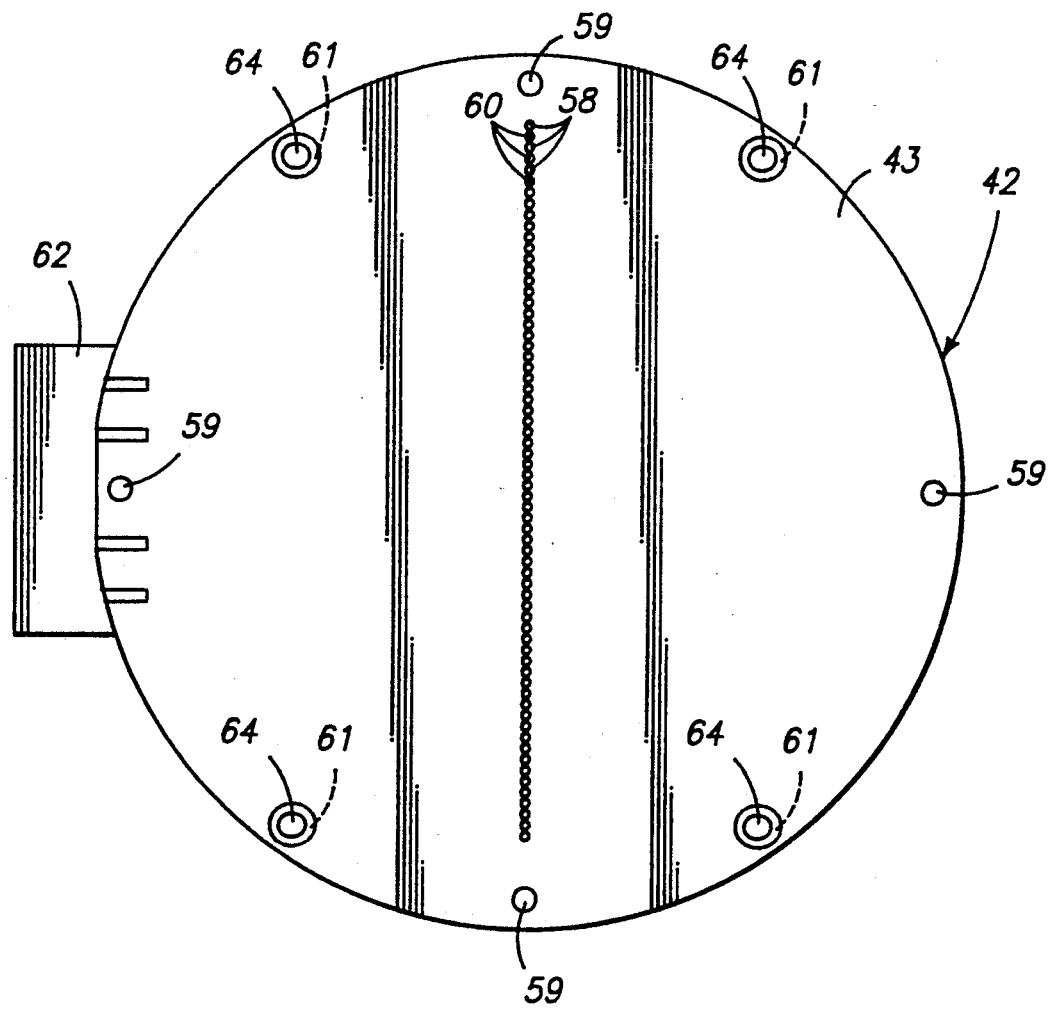
FIG. 5 is a top or bottom plan view of an upper plate of the FIG. 4 fixture.

Referring to FIGS. 4 and 5, member or top plate 42 is comprised of a high temperature resistant printed circuit board 43 having a series of alternating contact pins 58, 60 provided therealong. Pins 58 and 60 connect through circuit board 43 to an electrical edge connector 62. Edge connector 62 would be connected with a suitable electric supply for providing a Vcc voltage to pins 58 and a Vss voltage to pins 60. Pins 58 and 60 are positioned along the illustrated line for engagement with the respective Vcc buses 20 and Vss buses 22 respectively when a wafer is received within cavity 46. Circuit board 43 is provided with a series of holes 64 which are positioned and sized to slidably receive guide pins 56 of lower plate 44. Printed circuit board 43 is also provided with insulating doughnut-like spacers 61 about holes 64 for electrically isolating plate 50 from board 43 when the two are in juxtaposition. (FIG. 4) As well, a series of holes 59 are provided which align with threaded holes 57 of lower base 50. Such receive threaded bolts (not shown) for tightly securing members 42 and 44 relative to one another.

Circuit board 43 and edge connector 62 comprise an electrical connector means for supplying selected voltages to the wafer Vcc and Vss buses for imparting test cycling of the integrated circuits upon application of the selected voltages. In this manner, bottom plate 44 comprises a means for reverse biasing the wafer during test, while upper member 42 comprises the electrical connector means.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of processing and of testing a semiconductor wafer containing an array of integrated circuit dies, the wafer including areas of individual die circuitry and areas of distinct scribe line area which are separate from the individual die circuitry areas, the method comprising the following steps:

providing die test cycling circuitry on the wafer for test cycling individual dies;

providing a passivation layer atop the wafer;

etching contact openings through the passivation layer to Vcc and Vss pads associated with individual dies;

providing a layer of conductive material atop the wafer;

patterning the layer of conductive material to provide a Vcc bus and a Vss bus atop the dies which interconnect with the Vcc and Vss pads respectively, the Vcc and Vss busses each including respective straight-line bus portions extending fully between individual die circuitry areas, each straight-line portion overlying a plurality of the individual die circuitry areas, the Vcc bus electrically connecting with the test cycling circuitry;

burn-in testing the wafer with voltages being applied to the Vss and Vcc buses to cycle the individual dies during burn-in testing;

etching the Vcc bus and Vss bus from the wafer;

etching contact openings through the passivation layer to conductive pads on individual dies;

testing the individual dies on the wafer for operability by engaging the conductive pads with testing equipment;

identifying operable and inoperable dies;

severing through the wafer to singulate the dies; and collecting the operable dies.

2. The method of processing and of testing a semiconductor wafer of claim 1 wherein the array includes scribe line area between and separating individual dies, and further comprising providing the test cycling circuitry in the scribe line area.

3. The method of processing and of testing a semiconductor wafer of claim 1 wherein the step of providing die test cycling circuitry comprises providing individual test cycling circuitry associated with individual dies.

4. The method of processing and of testing a semiconductor wafer of claim 3 further comprising providing the individual test cycling circuitry on the individual dies.

5. The method of processing and of testing a semiconductor wafer of claim 3 wherein the array includes scribe line area between and separating individual dies, and further comprising providing the individual test cycling circuitry in the scribe line area.

6. The method of processing and of testing a semiconductor wafer of claim 1 further comprising utilizing the test cycling circuitry to:

write data to the dies and read data from the dies;

compare the data written to the dies with the data read from the dies; and provide an error indication if the data written to the dies is not the same as the data read from the dies.

7. The method of processing and of testing a semiconductor wafer of claim 1 further comprising patterning the wafer to provide permanent Vcc and permanent Vss pads on the individual dies, and patterning the wafer to provide sacrificial Vcc and Vss pads associated with the dies, the respective permanent and sacrificial pads being connected relative to one another in parallel, the Vcc bus connecting with the sacrificial Vcc pads, the Vss bus connecting with the sacrificial Vss pads.

8. The method of processing and of testing a semiconductor wafer of claim 7 further comprising patterning the wafer to provide the sacrificial Vcc and Vss pads on individual dies.

9. The method of processing and of testing a semiconductor wafer of claim 1 wherein the step of providing die test cycling circuitry comprises providing individual test cycling circuitry on the individual dies, a cycling test pad being associated with the individual test cycling circuitry and being provided on the individual dies and being engaged by the Vcc bus; the method further comprising:

patterning the wafer to provide permanent Vcc and permanent Vss pads on the individual dies, and patterning the wafer to provide sacrificial Vcc and Vss pads on the individual dies, the respective permanent and sacrificial pads being connected relative to one another in parallel on the individual dies, the Vcc bus connecting with the individual die sacrificial Vcc pads, the Vss bus connecting with the individual die sacrificial Vss pads.

10. The method of processing and of testing a semiconductor wafer of claim 1 further comprising patterning the conductive layer to provide fuses between the Vcc bus and individual Vcc pads.

11. The method of processing and of testing a semiconductor wafer of claim 1 further comprising patterning the wafer to provide permanent Vcc and permanent Vss pads on the individual dies, and patterning the wafer to provide sacrificial Vcc and Vss pads associated with the dies, the respective permanent and sacrificial pads being connected relative to one another in parallel, the Vcc bus connecting with the sacrifical Vcc pads, the Vss bus connecting with the sacrificial Vss pads, the conductive layer being patterned to provide fuses between the Vcc bus and the sacrificial Vcc pads.

12. The method of processing and of testing a semiconductor wafer of claim 1 wherein the step of providing die test cycling circuitry comprises providing individual test cycling circuitry on the individual dies, a cycling test pad being associated with the individual test cycling circuitry and being provided on the individual dies and being engaged by the Vcc bus; the method further comprising:

patterning the wafer to provide permanent Vcc and permanent Vss pads on the individual dies, and patterning the wafer to provide sacrificial Vcc and Vss pads on the individual dies, the respective permanent and sacrificial pads being connected relative to one another in parallel on the individual dies, the Vcc bus connecting with the individual die sacrificial Vcc pads, the Vss bus connecting with the individual die sacrificial Vss pads, the conductive layer being patterned to provide fuses between the Vcc bus and the sacrificial Vcc pads.

13. The method of processing and of testing a semiconductor wafer of claim 1 wherein the step of etching the Vcc bus and Vss bus from the wafer is conducted without any prior photomaking of the Vcc buss and Vss bus.

* * * * *